United States Patent [19]

Pohlack

[11] 4,441,789
[45] Apr. 10, 1984

[54] RESONANCE ABSORBER

[75] Inventor: Hubert Pohlack, Jena, German Democratic Rep.

[73] Assignee: Jenoptik Jena GmbH, Jena, German Democratic Rep.

[21] Appl. No.: 247,956

[22] Filed: Mar. 26, 1981

[30] Foreign Application Priority Data

Mar. 31, 1980 [DD] German Democratic Rep. ... 220063
Apr. 1, 1980 [DD] German Democratic Rep. ... 220110

[51] Int. Cl.³ .......................... G02B 5/28; G02B 5/22
[52] U.S. Cl. .................................................. 350/166
[58] Field of Search ............................. 350/164, 166

[56] References Cited

U.S. PATENT DOCUMENTS 4,048,039  9/1977  Daxinger ........................... 350/166

Primary Examiner—Bruce Y. Arnold
Attorney, Agent, or Firm—Jordan and Hamburg

[57] ABSTRACT

An improvement in a resonance absorber of refractive index n and absorption coefficient k wherein a medium of refractive index $n_a$ is disposed frontally thereof is disclosed in which the thickness of the absorption material is made equal to $m\lambda/(4n)$, where m is the whole number closest to $2n_a/(\pi k)$ where n equals $n_a$ and wherein the interference layers have alternatingly low and high refractive indices in that order when m is even and alternatingly high and low refractive indices in that order when m is odd.

6 Claims, 3 Drawing Figures

RESONANCE ABSORBER

BACKGROUND OF THE INVENTION

The invention relates to a resonance absorber comprised of moderately or weakly absorbing optical materials, for example, semiconductor materials, for the conversion of photon energy of electromagnetic radiation energy to other forms of energy for use in semiconductor-photodiodes, photoresistors, waveguide lasers, irreversible optical recording media, photothermal transformers for solar energy, and other physical operating components.

Absorbers of moderately or weakly absorbing materials for incident photons or electromagnetic radiation, respectively, are known in numerous embodiments. Such absorbers often have dimensions within the range of the penetration depth of the photons or the electromagnetic radiation, respectively. The penetration depth is defined as the length of the path along which the number of photons of the intensity of radiation has decreased to the fraction $e^{-4\pi}$. The depth of penetration, XE, becomes $x_E = \lambda/k$ because—as is well known—the radiation intensity I decays in substances having an absorption coefficient k according to the formula $$I = I_o \exp\left(-\frac{4\pi}{\lambda} kx\right),$$

where $I_o$ equals the intensity at point $x=0$, where x is the length of path described by the radiation and $\lambda$ the wavelength of the electromagnetic radiation. Due to the reflection occurring at the interfaces of absorbing materials, the radiation impinging on the surface is only incompletely absorbed. Therefore, the known methods for reduction of reflection use a plurality of absorbers so that up to 100% of the incident radiation that enters the absorber is absorbed along the depth of penetration.

The physical processes which are triggered by the photon-absorption, occur in numerous physical processes, although in a portion of the area of the absorbing material that is small compared to the depth of penetration, for instance in the zone in the immediate vicinity of the surface of the absorber. In that case the portion of energy absorbed outside of this zone is lost for the desired process. This effect is very disadvantageous in semiconductor methods for wavelengths having small absorption coefficients and also having large depths of penetration.

Therefore, it is possible to employ absorbing devices of relatively small dimension whose limiting planes are partially reflective as resonance absorbers, so that standing waves in the absorbing material between these planes result. The demands would not be adequately fulfilled by resonance absorbers of moderately or weakly absorbing materials, despite their advantage of having a relatively short absorber length. Even when the reflection of the anterior peripheral plane is considerably reduced externally by anti-reflection methods and when the posterior limits are occluded by a highly reflecting heavy metal layer which prevents the radiative energy from being transmitted through the whole system, the impinging radiation is still only incompletely absorbed within the resonance absorber because a considerable portion of the radiative energy from the resonance absorber enters the metal and is absorbed therein. Thus the radiation does not participate in the desired physical effect in the absorber which determines the function, for instance, of a semiconductor.

The invention provides a resonance absorber of small dimensions, wherein the available radiation or photon energy is used completely, or at least almost completely, for the process of energy transformation in the absorbing material.

The object of the invention is to provide a resonance absorber for the absorption of impinging photons of electromagnetic radiation where the spatial absorption range is reduced to be within a zone of the absorbing material which is technically desirable for the transformation of energy.

SUMMARY OF THE INVENTION

According to the invention, this object is achieved by using an absorbing material with a small coefficient of absorption, by using interference layers abutting at least the posterior side of the absorption material, and by fixing the length of absorber $d = m \cdot \lambda/4n$, where m is a whole number lying closest to a numerical value of $2n_a/\pi k$, and wherein the wavelength $\lambda$ is the effective wavelength of a definite selectable spectral absorption range, the absorber material has a refraction index n and an absorption coefficient k, and wherein $n_a$ is the refractive index of a material that is positioned in front of the absorption material. Each of the interference layers abutting the reverse or posterior side of the absorption material has an optical thickness of $\lambda/4$ and has alternatingly a low and a high refractive index, in that order, when m is even or alternatingly a high and a low refractive index, in that order, when m is odd. The number of the $\lambda/4$ interference layers is chosen in such a manner that, according to the refraction number equivalency principle (Jenaer Jahrbuch 1954, part 2, page 436, Gustav Fischer Verlag Jena), an equivalent refractive index of almost 0 results automatically in a posterior optical outer medium when m is an even number; and, an equivalent refractive index tending towards infinity results in a posterior optical medium tending towards infinity when m is an odd number. The invention reduces the area in which the photons or the electromagnetic radiation are at least almost completely absorbed, compared to the normal phonton penetration depth into the same absorption material at the identical wavelength. The absorbing material may be a plate or a layer, or it may have another geometric structure, as long as it allows all partial beams of the impinging radiation to describe equal paths from their entrance into the absorber until their exit.

In order to vary the optimal length of absorber within wide limits, quarterwave interference layers may be mounted between the absorption material and a frontally positioned outer medium, said quarterwave interference layers also having alternatingly high and low refractive indices or alternatingly low and high refractive indeces.

These interference layers provide the equivalent outer refractive indeces needed for the adjustment of the desired absorber length. That makes the length of the absorber variable within much larger limits than would be possible by direct variation of the refractive index of an extended anteriorly disposed simple optical medium. The interference layers as well as the length of absorber or the paths of the partial beams, respectively, are related to one another in such a manner that the effective depth of penetration of the radiation into the absorber is reduced, thereby obtaining a high volume density of completely or almost completely absorbed photon or radiation energy, respectively.

BRIEF DRAWING DESCRIPTION

The invention will now be explained in greater detail with reference to the drawings, wherein.

DETAILED DISCLOSURE

Figure 1:
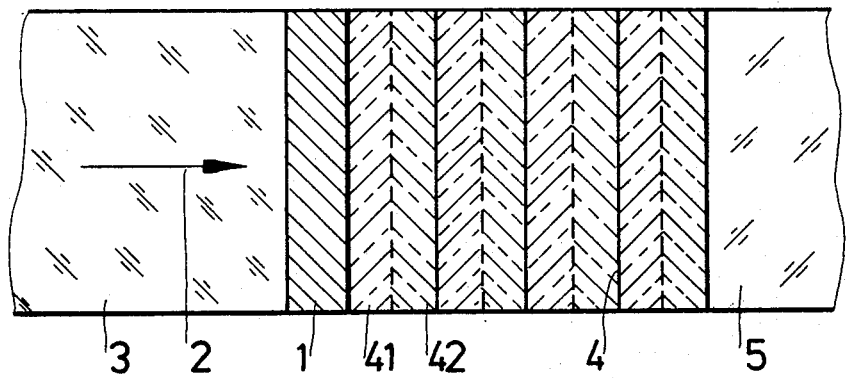
FIG. 1 is an enlarged cross sectional view of a first embodiment of the invention.

In FIG. 1 a resonance absorber layer 1 consists of amorphous silicon. It is prepared according to known methods technologies of. Electromagnetic radiation 2, having a wavelength $\lambda = 0920$ µm impinges on a frontally disposed external medium 3 of index of refraction $n_a = 1.0$, normal or almost normal to the frontal boundary surface of resonance absorber layer 1. A posteriorly disposed interference layer sequence 4, positioned between resonance absorber layer 1 and an extended posterior external medium 5 of index of refraction $n_b = 1.52$, consists of four layer pairs. Each pair of layers consists of a low-refracting interference layer 41 (refraction index $n_n = 1.38$) and a high-refracting interference layer 42 (refraction index $n_h = 2.3$). The thickness of each individual interference layer is $d = \lambda/4n_n$ or $d = \lambda/4n_h$, respectively. Thus it is possible to calculate the effective refraction number for the posterior external medium, by using the known equivalence principle for refractive indices of thin optical layers and the formula $n_{b,equ} = (n_n^2/n_h^2)^P \cdot n_b$ (where P equals the number of layer pairs), giving $n_{b,equ} \approx 0.026$, thus a number sufficiently close to zero according to the characteristics of the invention. The refractive index n and absorption coefficient k of the silicon layer, at a wavelength $\lambda$ of 0.920, are 3.80 and 0.01 respectively. Thus, assuming that $n_a$ equals 1.0 and using the formula according to the invention: $m \approx 2n_a/k$ is calculated and results in 63.66. The nearest whole number is 64. That results for the optical thickness of the resonance absorber layer 1 $nd = m\lambda/4 = 64 \ \lambda/4$, and the geometric thickness $d = m\lambda/4 = 3.874$ µm. Due to the fact that exact setting of the absorber length, in other words the thickness of the resonance absorber, is difficult to obtain directly, the degree of reflection at wavelength $\lambda = 0.920$, showing in a known manner maxima and minima with growing layer thickness during the coating process, may be measured, and the process of coating may be interrupted, once the deepest reflection minimum has been reached. For this example of an embodiment of a resonance absorber there is a degree of transmission of about 2% and a degree of reflection of less than $10^{-3}$, so that approximately 98% of the impinging radiation is absorbed in a resonance absorber layer having a layer thickness of 3.874 µm.

Figure 2:
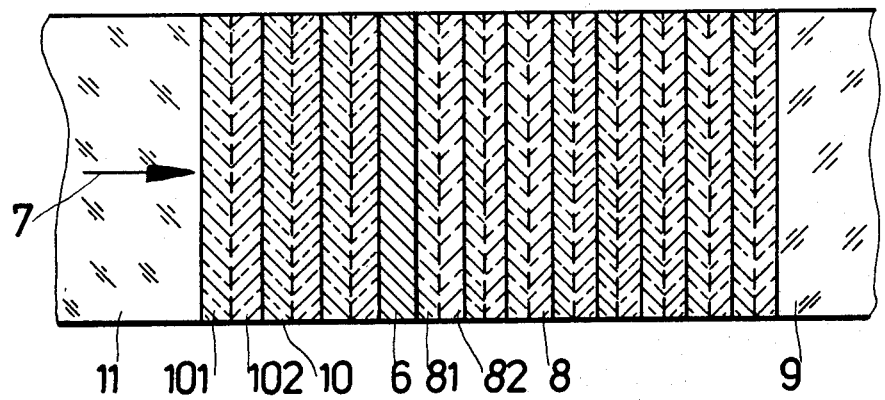
FIG. 2 is an enlarged cross sectional view of a second embodiment of the invention.

According to FIG. 2 the resonance absorber layer 6 consists of amorphous silicon having a refractive index $n = 3.8$ and an absorption coefficient $k = 0.01$ at a wavelength $\lambda = 0.920$ µm of a normal or almost normal impinging electromagnetic radiation 7. A posteriorly disposed interference layer series 8 is comprised of eight interference layer pairs, each consisting of a low refractive index and a high refractive index interference layer 81, 82 and disposed in that order between the resonance absorber layer 6 and an external medium 9 (refractive index $n_b = 1.52$), so that an effective refractive index for the posterior external medium 9, $n_{b,equ}$ is smaller than $10^{-3}$. A numerical value of 2 was fixed for m in order to realize the very small absorber layer thickness $d = m \cdot \lambda/4n = \lambda/2n = 0.121$ µm.

As a result, from the relation $m \approx 2n_a/\pi k$ for the effective equivalent refractive index of frontal external medium 11 (air), $n_{a,equ} \approx \pi k = 0.0314$. That value may be approximated by using a series of interference layers 10 between the resonance absorber layer 6 and the extended frontal external medium, said series 10 consisting of three pairs each of a low refractive index and a high refractive index interference layer 101 and 102.

Thereby, for the second embodiment of the invention, a transmission degree of almost zero, a degree of reflection of about $10^{-5}$ and thus an absorption of approximately 100% within the resonance absorber layer of slightly more than 100 nm thickness, are obtained.

Figure 3:
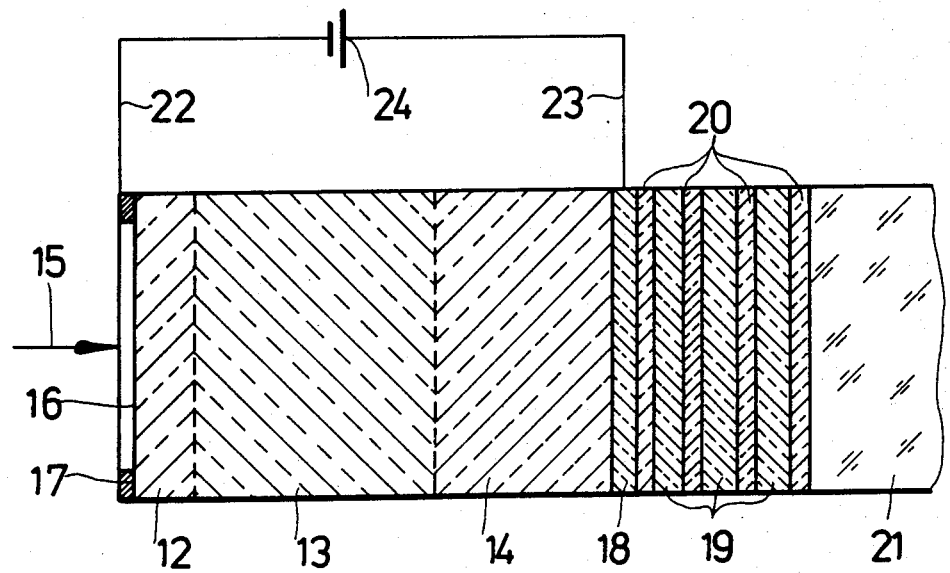
FIG. 3 is an enlarged cross sectional view illustrating the use of the invention in a photodiode.

FIG. 3 shows a photodiode of amorphous silicon, whose barrier layer is formed by a p-i-n structure, consisting of a highly doped P-area 12, an intrinsic area having high semiconductor purity 13 and a doped N-area 14. Radiation to be detected or measured, respectively, 15 impinges normal to the p-i-n interface 16, upon which is disposed an annular electrode 17. The N-area is followed by a series of interference layers 18, 19, 20, where each layer has an optical thickness of $\lambda/4$ and where the interference layer 18 consists of indium-doped zinc oxide which serves as an electrode and has a refractive index of approximately 1.8. The interference layers 19, 20 alternate and have low ($n_n = 1.34$) and high ($n_n = 2.40$) refractive indices. The whole combination rests on a stable base 21 consisting, for example, of glass. The electrodes 17 and 18 are connected to a source of potential 24 at terminals 22, 23 in order to apply the diode bias potential. When using the numerical values for m and d, calculated in accordance with FIG. 1, the P-zone is 0.1 to 1 µm. Due to the fact that the direct way to adjust the optimal thickness of the semiconductor is very complicated due to negligible deviations of refractive index and coefficients of absorption, which are always possible, the reflection degree is measured in known manner at a wavelength of 0.920 µm. This degree of reflection has maxima and minima as the thickness of the layer increases. The coating process is stopped as soon as the deepest minimum of reflection has been reached. In the arrangement of photo diodes, described in FIG. 3, a degree of transmission $\tau \approx 2\%$, a degree of reflection $\rho \approx 0.0001\%$ and absorption $\alpha \approx 98\%$ are obtained, whereby the area where absorption occurs is only slightly larger than the barrier field or the depletion zone, respectively, thus allowing all impinging photons to become effective. The depletion zone realized in the described arrangement possesses, relative to its range, such a numerical value as needed from known studies and calculations for handling very high Laser pulse frequencies.

The radiation 15 may also impinge parallel to the barrier field. In that case the interference layers 18, 19 and 20 must be arranged in tandem in such a manner that they are disposed at right angles to the separation lines of regions 12, 13 and 14.

I claim:

1. In a resonance absorber for the absorption of impinging photons of electromagnetic radiation having an effective wavelength $\lambda$, said resonance absorber including (1) an absorption material of refractive index n and absorption coefficient k and having a medium of refractive index $n_a$ disposed frontally thereof; (2) an external optical element positioned posteriorly of said absorption material, and (3) a series of interference layers located between said absorption material and said external optical element, each of said interference layers having an optical thickness of substantially $\lambda/4$, and the series of layers arranged to have alternatingly low and high refractive indices, the improvement wherein: the thickness of said absorption material is equal to $m\lambda/(4n)$, where m is the whole number closest to $2n_a/(\pi k)$, and where the refractive index n of the absorption material equals the refractive index $n_a$ of the said medium disposed frontally of said absorption material, and wherein the interference layers have alternatingly low and high refractive indices in that order when m is even and alternatingly high and low refractive indices in that order when m is odd.

2. The resonance absorber according to claim 1, wherein another series of interference layers is positioned, between said medium of refractive index $n_a$ and absorption material, said last mentioned interference layers having optical thicknesses of substantially $\lambda/4$ and arranged in pairs of layers having different refraction indices.

3. The resonance absorber according to claim 1 wherein said absorption material consists of amorphous silicon.

4. The resonance absorber according to claim 1 wherein said adsorption material comprises a p-i-n structure having a highly doped P-area on its frontal side, a doped N-area on its posterior side, the P and N areas being separated by an intrinsic area.

5. The resonance absorber according to claim 1 wherein a further interference layer is provided between said absorption material and the frontal layer of said first mentioned interference layers, said further interference layer serving as an electrode.

6. The resonance absorber according to claim 5 wherein said further interference layer is of indium-doped zinc oxide, and has a refractive index of approximately 1.8.

* * * * *